United States Patent [19]

Lee

[11] Patent Number: 5,183,776
[45] Date of Patent: Feb. 2, 1993

[54] HETEROEPITAXY BY GROWTH OF THERMALLY STRAINED HOMOJUNCTION SUPERLATTICE BUFFER LAYERS

[75] Inventor: Jhang W. Lee, Richardson, Tex.

[73] Assignee: Texas Instruments Incorporated, Dallas, Tex.

[21] Appl. No.: 390,472

[22] Filed: Aug. 3, 1989

Related U.S. Application Data

[63] Continuation of Ser. No. 912,028, Sep. 26, 1986, abandoned.

[51] Int. Cl.$^5$ .................. H01L 21/203; H01L 21/205
[52] U.S. Cl. ..................................... 437/110; 437/112; 437/132; 437/976
[58] Field of Search ............... 437/108, 132, 110, 112, 437/248, 976; 148/DIG. 97

[56] References Cited

U.S. PATENT DOCUMENTS

| | | | |
|---|---|---|---|
| 4,551,394 | 11/1985 | Betsch | 428/641 |
| 4,561,916 | 12/1985 | Akiyama et al. | 437/976 X |
| 4,587,717 | 5/1986 | Daniele et al. | 29/569 L |
| 4,632,712 | 12/1986 | Fan et al. | 148/175 |
| 4,742,020 | 5/1988 | Roy | 437/61 |

OTHER PUBLICATIONS

Wang, "Molecular Beam Epitaxial Growth... of GaAs and AlGaAs on Si(100)", App. Phys. Lett., vol. 44 No. 12, Jun. 15, 1984, pp. 1149–1151.
Soga et al., "Charaterization of Epitaxially Grown GaAs on Si...", J. Appl. Phys., vol. 57 No. 10, May 15, 1985, pp. 4578–4582.
Akiyama et al., "Growth of High Quality GaAs Layers on Si...", J. Crystal Growth, vol. 77 (1986), pp. 490–497.
Wright et al., "Polar–on–Nonpolar Epitaxy: ... GaP on Si(211) Surfaces", J. Vac. Sci. Technol., vol. 21 No. 2, Jul./Aug. 1982, pp. 534–539.
Tsaur et al., "Molecular Beam Epitaxy of GaAs and AlGaAs on Si", Appl. Phys. Lett., vol. 45 No. 5 Sep. 1, 1984, pp. 535–536.
Metze et al., "Metal–Semiconductor Field–Effect Transistors ... ", Appl. Phys. Lett. vol. 45 No. 10, Nov. 15, 1984, pp. 1107–1109.
Nishi et al., "Growth of Single Domain GaAs on 2 inch Si...", Jpn. J. Appl. Phys., vol. 24 No. 6, Jun., 1985 pp. L391–L393.
Sakai et al., "Room-temperature laser operation of AlGaAs ... ", Appl. Phys. Lett. vol. 48 No. 6, Feb. 10, 1986, pp. 413–414.
Akiyama et al. "Growth of GaAs on Si by MOCVD", J. Crystal Growth, vol. 68, 1984 pp. 21–26.
Mizuguchi et al., "MOCVD GaAs Growth on Ge(100) and Si(100) Substrates", J. Crystal Growth, vol. 77 (1986), pp. 509–514.

Primary Examiner—Mary Wilczewski
Attorney, Agent, or Firm—Richard A. Stoltz; Richard L. Donaldson; Jay Cantor

[57] ABSTRACT

Preferred embodiments disclose include methods of fabrication and integrated circuits (30) in GaAs layers (38, 40) on silicon substrates (32) with the gallium arsenide grown by MBE or MOCVD and containing thermally-strained superlattices (36) and post-growth high temperature annealing to lower defect density. The annealing confines dislocations to a thin network at the interface of the GaAs buffer layer (34) and the silicon substrate (32).

6 Claims, 2 Drawing Sheets

HETEROEPITAXY BY GROWTH OF THERMALLY STRAINED HOMOJUNCTION SUPERLATTICE BUFFER LAYERS

This application is a continuation of application Ser. No. 912,028, filed Sep. 26, 1986, now abandoned.

BACKGROUND OF THE INVENTION

1. Field of the Invention

The present invention relates to growth of semiconductor materials, and, more particularly, to heteroepitaxial growth such as gallium arsenide on silicon.

2. Description of the Related Art

Recently, many researchers have investigated growth of semiconductor-device quality gallium arsenide (GaAs) on silicon wafers and fabrication of active devices in the GaAs. Such devices would combine the higher mobility of carriers in GaAs with the greater mechanical strength and thermal conductivity of a silicon substrate. For example, R. Fishcer et al. GaAs/AlGaAs Heterojunction Bipolar Transistors on Si Substrates. 1985 IEDM Tech. Digest 332, report GaAs/AlGaAs heterojunction bipolar transistors grown on silicon substrates and having current gains of $\beta = 13$ for a 0.2 $\mu$m thick base. Similarly, G. Turner et al, Picosecond Photodetector Fabricated in GaAs Layers Grown on Silicon and Silicon On Sapphire Substrates, 1985 IEDM Tech. Digest 468, report response times of 60 picoseconds for photoconductive detectors fabricated in GaAs on silicon. These articles also note that majority carrier devices such as MESFETs fabricated in GaAs on silicon have performance approaching that of homoepitaxial devices: and this has encouraged efforts to integrate GaAs/AlGaAs optoelectronic and high-frequency devices and silicon devices on the same wafer to utilize high-data-rate optical interconnections to reduce the number of wire interconnections. Selective recrystallization of amorphous GaAs can use the high resistivity of noncrystalline GaAs; see, for example, A. Christou et al, Formation of (100) GaAs on (100) silicon by Laser Recrystallization, 48 Appl. Phys. Lett. 1516 (1986). However, defects in GaAs grown on silicon substrates remain a problem.

Various methods have been used to limit defects in GaAs grown on silicon, and these include deposition of prelayers of As or Ga, AlAs/GaAs superlattices for growth initiation, silicon-germanium transition layers, and various strained layer superlattices (InGaAs/GaAs for example) as buffer layers for the purpose of filtering out threading dislocations. But such methods have drawbacks including unexpected misfit dislocation and thermal cracks at strained interfaces during epitaxial growth or later high temperature processing steps. Further, these methods are not simple.

SUMMARY OF THE INVENTION

The present invention provides thermally-strained-homojunction superlattice buffer layers with post-growth high-temperature anneal for semiconductor heteroepitaxy devices and methods of semiconductor heteroepitaxial growth. Preferred embodiments include molecular beam epitaxy (MBE) and metalorganic chemical vapor deposition (MOCVD) growth of GaAs on silicon with alternating short period ramping of substrate temperature between 400° and 600° C. to create thermally strained thin layers of GaAs (these layers form a kind of strained-layer superlattice which bends the direction of dislocation propagation) and a post-growth high-temperature anneal at 850° C. for several minutes to reduce defect density.

The use of homojunctions in the strained-layer superlattice solves the problems of filtering out threading dislocations without introducing misfit dislocations or thermal cracks at strained interfaces. And the post-growth high temperature anneal lowers defect density without involved processing.

BRIEF DESCRIPTION OF THE DRAWINGS

The drawings are schematic for clarity.

DESCRIPTION OF THE PREFERRED EMBODIMENTS

Figure 1:
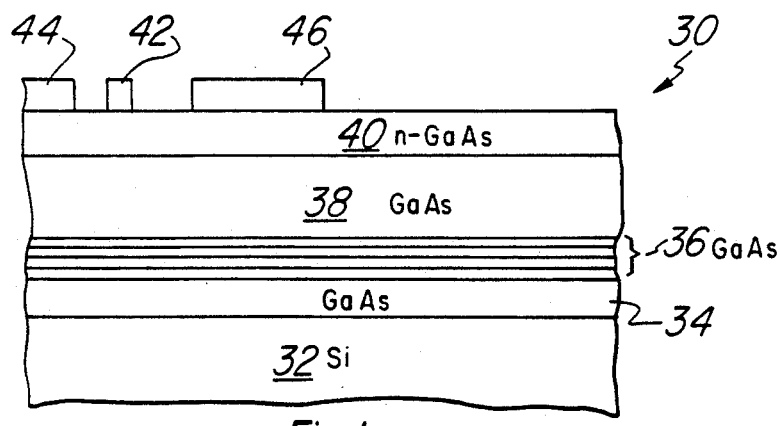
FIG. 1 illustrates in cross sectional elevation view a portion of a first preferred embodiment heteroepitaxial semiconductor wafer with field effect transistors.

FIG. 1 is a schematic cross sectional view of a portion of a first preferred embodiment GaAs on silicon integrated circuit, generally denoted 30, and including silicon substrate 32, GaAs buffer epilayer 34 of thickness 0.1 $\mu$m, GaAs thermally strained superlattice epilayer 36 of thickness 0.1 $\mu$m, semi-insulating GaAs epilayer 38 of thickness 3.0 $\mu$m, and n-type GaAs epilayer 40 of thickness 0.5 $\mu$m which is the active layer with gate 42, source ohmic contact 44, and drain ohmic contact 46. Thermally strained superlattice 36 consists of ten sublayers of undoped GaAs grown at alternating high and low temperatures. The different growth temperatures for the GaAs film on silicon substrate 32 implies the GaAs sublayers will form a strained-layer superlattice which filters out dislocations propagating from the interface of silicon 32 and GaAs buffer layer 34.

A better understanding of thermally strained superlattice 36 arises from consideration of a first preferred embodiment method of fabrication of integrated circuit 30 as follows:

(a) An undoped silicon wafer 32 of (100) orientation but tilted 3-4 degrees toward a (011) zone is cleaned and inserted into an MBE machine in a substrate holder utilizing indium-free mounting. After outgassing, GaAs buffer epilayer 34 is grown on substrate 32 at low substrate temperature (525° C.) and low growth rate (0.4 $\mu$m/hr) to a thickness of 0.1 $\mu$m.

Figure 2:
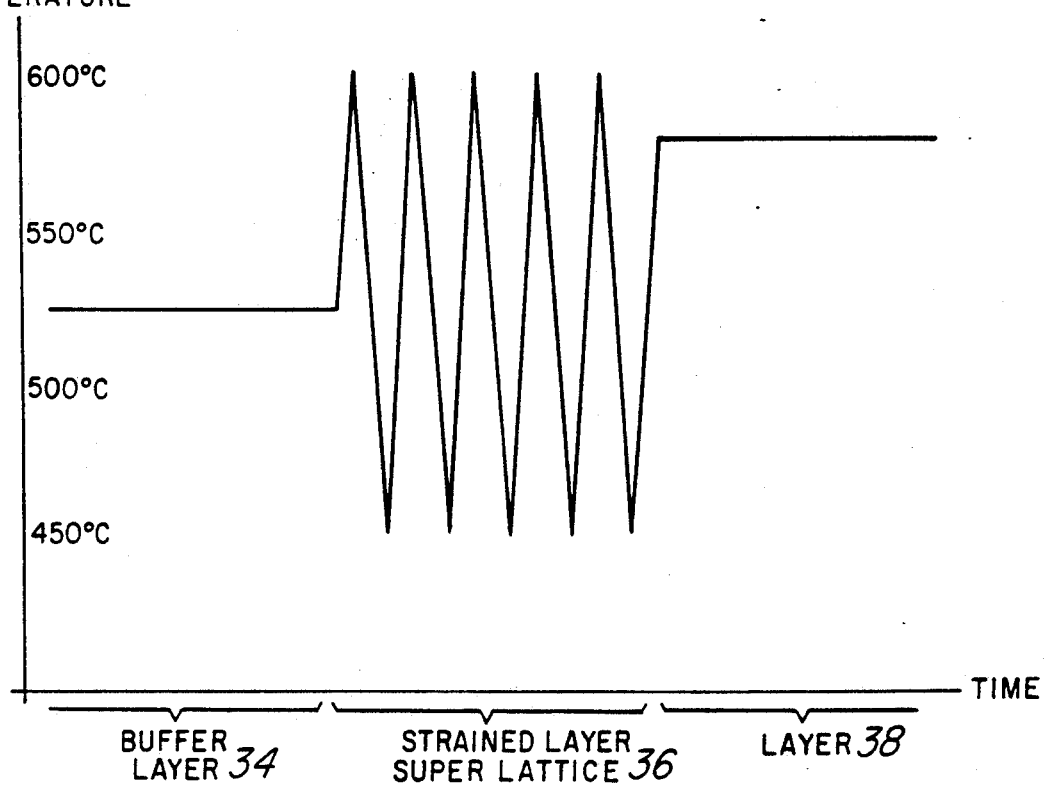
FIG. 2 shows the time dependence of substrate temperature during the first preferred embodiment method of heteroepitaxial semiconductor growth.

(b) The growth of GaAs at 0.4 $\mu$m/hr is continued but with the substrate temperature alternating between 450° and 600° C. every 90 seconds to produce ten sublayers of nominal thickness 100 Å to form strained layer superlattice 36. FIG. 2 shows the time dependence of the substrate temperature during growth.

(c) The substrate temperature is raised to 580° C. and the growth of GaAs is continued but at a rate of 0.9 $\mu$m/hr to grow epilayers 38 and 40; silicon dopants are included during the growth of epilayer 40.

(d) Lastly, the multilayered substrate is removed from the MBE machine and field effect transistors and other devices formed in the surface by standard processing.

The use of thermally strained layer superlattice 36 provides a very simple-to-grow structure to filter out the dislocations propagating from the interface of the GaAs on the silicon. The complexities of growing strained layer superlattices such as GaAs/InGaAs are avoided, and the thermally strained layer superlattice can also be easily grown in MOCVD because only the substrate temperature is varied-not the growth components.

Figure 3:
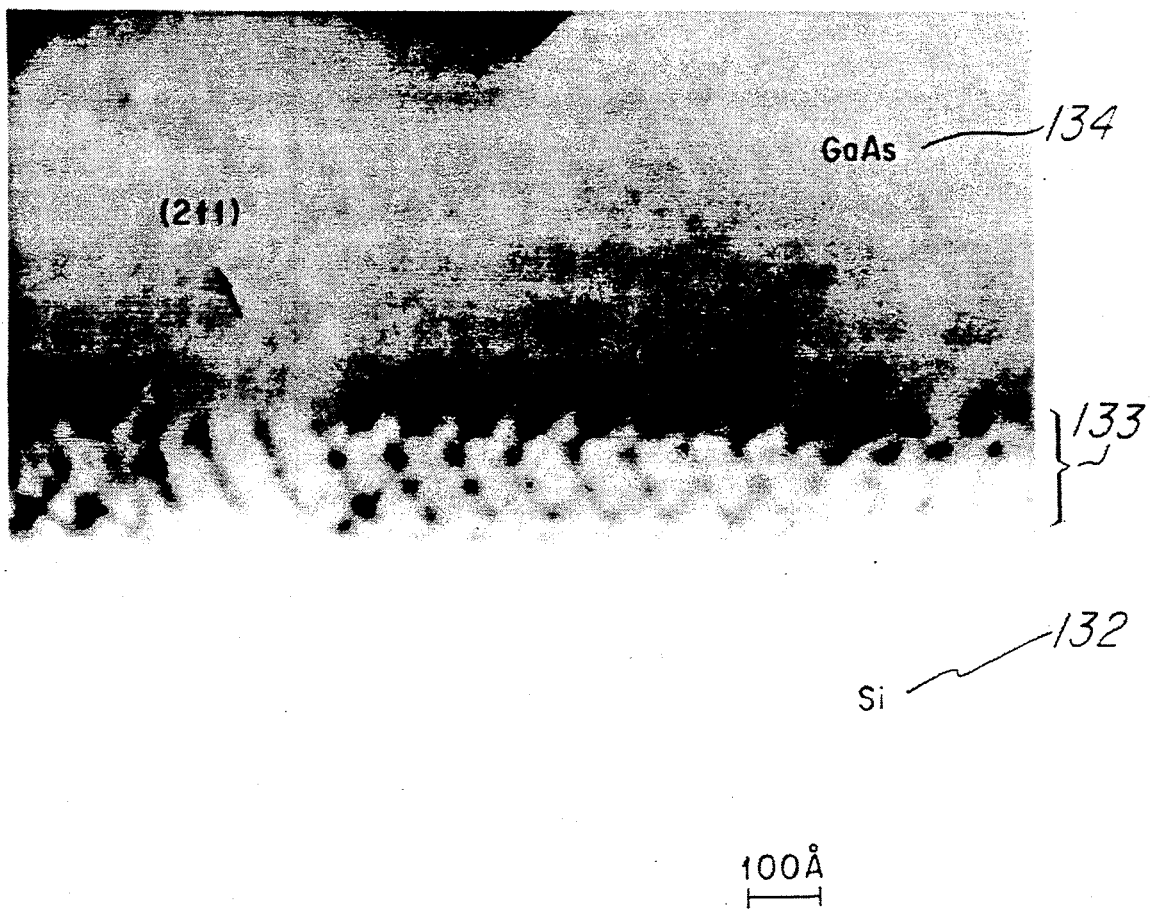
FIG. 3 is a transmission electron micrograph of the interface region in a second preferred embodiment integrated circuit.

Second preferred embodiment heteroepitaxial integrated circuit, generally denoted 130, is similar to circuit 30 except without the thermally strained layer superlattice. That is, circuit 130 includes silicon substrate 132, GaAs buffer epilayer 134 of thickness 0.2 $\mu$m, semi-insulating GaAs epilayer 138 of thickness 5.0 $\mu$m, n-type GaAs epilayer of thickness 0.4 $\mu$m, and gates 142 and ohmic contacts 144 and 146 for field effect transistors. The approximately 150 Å of buffer epilayer 134 abutting silicon substrate 132 contains regular network 133 of misfit dislocations arising from the four percent lattice mismatch at the interface of buffer layer 134 with silicon substrate 132, but beyond this network very few dislocations appear and twins and stacking faults are absent. The total defect density away from the interface is about $10^5/cm^3$. See FIG. 3 which is a transmission electron micrograph of the interface and the adjacent GaAs 134 and silicon 132 illustrating network 133.

Further understanding of the properties of circuit 130 come from consideration of the second preferred embodiment method of fabrication as follows:

(a) An undoped silicon wafer 132 of (100) orientation but tilted 3-4 degrees toward a (011) zone is cleaned and inserted into an MBE machine in a substrate holder utilizing indium-free mounting. After outgassing, GaAs buffer epilayer 34 is grown on substrate 32 at low substrate temperature (525° C.) and low growth rate (0.4 $\mu$m/hr) to a thickness of 0.2 $\mu$m.

(b) The substrate temperature is raised to 580° C. and the growth of GaAs is continued but at a rate of 0.9 $\mu$m/hr to grow epilayers 138 and 140 (not yet doped).

(c) The multilayered substrate is removed from the MBE machine and silicon is implanted at 180 ke V to dope epilayer 140 n-type.

(d) The substrate is then inserted in a quartz tube and annealed in a hydrogen and arsenic overpressure of one atmosphere at 850° C. for fifteen minutes. Note that the temperature is ramped up to 850° C. in six minutes.

(e) Lastly, field effect transistors and other devices formed in the surface by standard processing.

The same post-growth anneal can be performed after some more standard processing such as further patterned ion implantation. The anneal effectiveness diminishes for shorter times and lower temperatures, and no longer anneals or higher temperatures can cause dopant migration and more difficult containment of the arsenic. The useful ranges for the anneal appear to be from one to twenty-four hours at lower temperatures such as 750° C. to ranges of three to five minutes at higher temperatures such as 900° C. Also, the temperature could be varied during the anneal; for example, an initial two minutes at 900° C. could be followed by ten minutes at 800° C.

Third preferred embodiment integrated circuit 230 is similar to circuit 30 together with the interface network of circuit 130. In particular, the third preferred embodiment method of fabrication follows steps (a) and (c) of the first preferred embodiment method and then steps (d) and (e) of the second preferred embodiment method.

MODIFICATIONS AND ADVANTAGES

Various modifications of the preferred embodiment devices and methods may be made while retaining the feature of thermally strained homojunction superlattices and post-growth high temperature anneal. For example, various materials may be used such as gallium phosphide, aluminum arsenide, ternary alloys like $Al_xGa_{1-x}As$ and $Hg_{1-x}Cd_xTe$, quarternary alloys like $In_xGa_{1-x}As_yP_{1-y}$, and substrates like CdTe and silicon-on-insulator; of course, the temperatures for growth and anneal will depend upon the materials used.

What is claimed is:

1. A method for heteroepitaxial growth of semiconductors, comprising the steps of:
   (a) providing a substrate of a first semiconductor material;
   (b) growing a first layer of a second semiconductor material on said substrate at a first temperature;
   (c) growing a second layer of said second semiconductor material on said first layer at a second temperature differing from said first temperature;
   (d) growing a third layer of said second semiconductor material on said second layer at said first temperature;
   (e) growing a fourth layer of said second semiconductor material on said third layer at said second temperature;
   (f) said first, second, third, and fourth layers each sufficiently thin to accommodate strain and together forming a strained layer superlattice;
   (g) growing a fifth layer of said second semiconductor material on said superlattice.

2. The method of claim 1, further comprising the step of:
   (a) growing a buffer layer of said second semiconductor material on said substrate prior to growth of said first layer.

3. The method of claim 2, further comprising the steps of:
   (a) growing at least one more layer for said superlattice prior to growth of said fifth layer.

4. The method of claim 3, wherein:
   (a) said growth is by molecular beam epitaxy;
   (b) said first semiconductor material is silicon; and
   (c) said second semiconductor material is gallium arsenide.

5. The method of claim 3, comprising the further step of:
   (a) after growth of said fifth layer, annealing the layered substrate at a temperature substantially greater than the growth temperatures.

6. The method of claim 4, comprising the further step of:
   (a) after growth of said fifth layer, annealing the layered substrate at a temperature in the range of about 750 to 900 degrees C.

* * * * *